United States Patent
Spitz

(10) Patent No.: US 6,667,545 B1
(45) Date of Patent: Dec. 23, 2003

(54) RECTIFIER DIODE WITH IMPROVED MEANS FOR TENSION RELIEF OF THE CONNECTED HEADWIRE

(75) Inventor: Richard Spitz, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 08/656,319

(22) PCT Filed: Nov. 26, 1994

(86) PCT No.: PCT/DE94/01400
§ 371 (c)(1),
(2), (4) Date: Aug. 12, 1996

(87) PCT Pub. No.: WO95/15578
PCT Pub. Date: Jun. 8, 1995

(30) Foreign Application Priority Data

Dec. 3, 1993 (DE) .......................... 43 41 269

(51) Int. Cl.⁷ .................. H01L 23/04; H01L 23/12; H01L 23/16; H01L 29/91
(52) U.S. Cl. .................. 257/688; 257/724; 257/719; 257/694
(58) Field of Search .................. 257/688, 724, 257/694, 727, 717–719, 714, 722, 690

(56) References Cited

U.S. PATENT DOCUMENTS

| 3,475,662 A | * | 10/1969 | Zido | 312/234 |
| 4,314,271 A | * | 2/1982 | Heyke et al. | 252/724 |
| 4,328,512 A | * | 5/1982 | Heyke et al. | 257/724 |
| 5,005,069 A | * | 4/1991 | Wasmer et al. | 257/694 |
| 5,206,793 A | * | 4/1993 | Bondrant et al. | 257/719 |

* cited by examiner

Primary Examiner—Tom Thomas
Assistant Examiner—Alexander Oscar Williams
(74) Attorney, Agent, or Firm—Michael J. Striker

(57) ABSTRACT

The rectifier diode includes a press-fit base (12) including an axially extending substantially securing region (14) for a semiconductor chip (20); a head wire (24) attached to the semiconductor chip (20); an encapsulation (40) for at least an end portion (26) of the head wire (24) connected to the semiconductor chip (20); a collar (44) extending from a peripheral end portion (42) of the securing region (14), which extends axially beyond a securing face (16) of the securing region (14) and is inclined to an axis (50) of the securing region (14). The securing face (16) is closer to the head wire (24) than is an outer edge region (12') of the press-fit base (12). The collar (44) is in one-piece with the securing region (14) and includes a first portion (60) extending from the peripheral end portion (42) and inclined to the axis (50) at a first positive angle ($\alpha'$) and a second portion (62) extending from the first portion (60) and inclined at a second positive angle ($\alpha$) such that the second positive angle ($\alpha$) is greater than the first positive angle ($\alpha'$). The encapsulation (40) surrounds and encloses the securing region (14) as well as the end portion (26) of the head wire (24) and extends below the securing face (16) so that an undercut region (46) axially below the collar (44) is filled with the encapsulation (40) to provide an improved tension relief between the head wire (24) and the securing region (14).

12 Claims, 3 Drawing Sheets

RECTIFIER DIODE WITH IMPROVED MEANS FOR TENSION RELIEF OF THE CONNECTED HEADWIRE

BACKGROUND OF THE INVENTION

The invention relates to a rectifier diode including a press-fit base provided with an axially extending securing region for a semiconductor chip, a head wire secured to the semiconductor chip and an encapsulation of the head wire as well as means for tension relief of the head wire.

It is known to make rectifier diodes for medium and high capacity in the form of press-fit diodes. The press-fit diodes have a press-fit base that is press-fitted into a corresponding recess of a securing element. At the same time, the securing element takes on the task of permanent thermal and electrical connection of the rectifier diode. Such arrangements are known in automotive engineering, for instance, where they are used as rectifiers in motor vehicle generators. The press-fit base has a securing region on which a semiconductor chip is secured, for instance by soldering. Secured on the semiconductor chip in turn, likewise by soldering, for instance, is a so-called head wire, which is firmly connected electrically, for instance by soldering or welding, to a phase supply line of the motor vehicle generator.

In motor vehicle operation, vibration occurs, which is transmitted via the vehicle generator to the rectifier diode and expose it to considerable tensile strain. To enable reducing this tensile strain, it is known to encapsulate the rectifier diode and thus to establish a positive engagement between the head wire and the press-fit base. This positive engagement is intended to provide relief of tensile strain for the vulnerable semiconductor chip and the solder layers between the semiconductor chip and the press-fit base, on the one hand, and the head wire, on the other.

To enable increasing this tension relief, it has already been proposed, such as in German Published, Non-Examined Patent Application DE-OS 41 12 286, that additional means be provided that protrude into the encapsulation. DE 41 12 286 describes a wall extending obliquely beside the semiconductor chip and enclosed by the encapsulation. The wall is located in the immediate vicinity of the semiconductor chip and has a height that protrudes above the semiconductor chip. In this embodiment, the desired tension relief can be controlled solely by way of the height of the wall. It is disadvantageous, however, that the higher the wall, the more the semiconductor chip is shielded before the encapsulation is made, so that the side faces of the chip, after the semiconductor chip has been soldered in place, are only very poorly accessible for passivation.

SUMMARY OF THE INVENTION

It is an object of the present invention to provide an improved rectifier diode of the above-described type which does not have the above-described disadvantages.

According to the invention, the rectifier diode comprises a press-fit base including an axially extending securing region for the semiconductor chip; a head wire attached to the semiconductor chip; an encapsulation for at least a portion of the axially extending securing region and an end portion of the head wire connected to the semiconductor chip and a collar arranged extending from a peripheral end portion of the securing region, extending axially beyond a securing face for the semiconductor chip on the securing region and inclined to an axis of the securing region. The securing face is closer to the head wire than an outer edge region of the press-fit base, the collar is in one-piece with the securing region, the collar includes a first portion and a second portion, the first portion extends from the peripheral end portion of the securing region and is inclined to the axis at a first positive angle and the second portion of the collar extends from the first portion and is inclined at a second positive angle such that the second positive angle is greater than the first positive angle.

The rectifier diode according to the invention has the advantage over the prior art that a reliable tension relief of the rectifier diode is attained in a simple way, and access by a passivation agent to the side faces of the semiconductor chip is not made more difficult. Because a collar extending at an angle to an axial of the securing region and preferably protruding axially beyond a securing face of the securing region is located on an outer encompassing termination of the securing region, it is possible by simple geometrical variations of the collar to exert an influence on the encapsulation parameters that substantially affect the tension relief. Particularly by an advantageous selection of the length and/or approach angle and/or the shaping of the collar, a length of the encapsulation that is decisive for the tension relief can be established as a function of other known parameters, such as the modulus of elasticity of the encapsulation.

In a preferred feature of the invention, the collar is formed of individual spaced-apart segments, so that there is always a gap between each collar segment. As a result of this feature it is highly advantageously possible not only, as already noted, to increase the tension relief substantially, but also to assure unhindered flow of a passivation agent to the semiconductor chip.

BRIEF DESCRIPTION OF THE DRAWING

The invention will be described in further detail below in exemplary embodiments, in conjunction with the associated drawings, in which.

DESCRIPTION OF THE PREFERRED EMBODIMENTS

Figure 1:
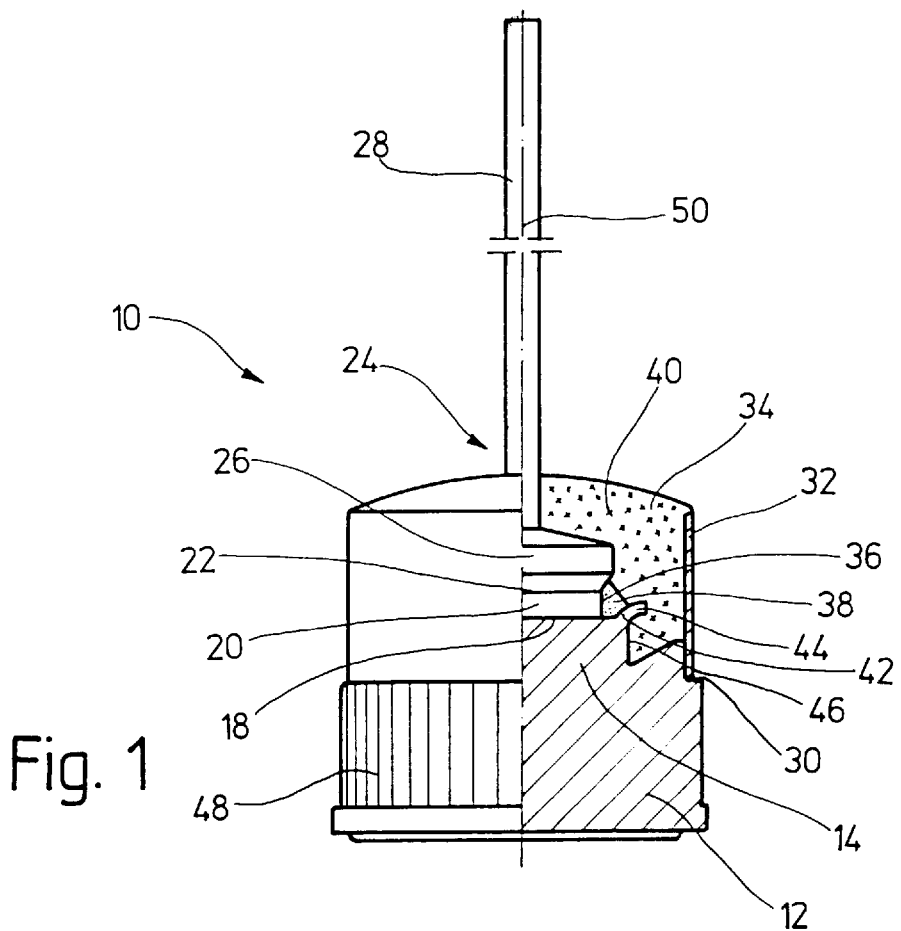
FIG. 1 is a schematic partially cross-sectional, partially side view of a rectifier diode according to the invention.

FIG. 1 shows a rectifier diode, generally identified by reference numeral 10, in a partially cutaway cross section. The rectifier diode 10 has a press-fit base 12, which comprises an outer edge region 12'. and an axially extending securing region 14. The securing region 14 is smaller in diameter than the outer edge region 12'. The securing region 14 terminates in a securing face 16, which is elevated in relation to the outer edge region 12' of the base 12 on which a semiconductor chip 20 is secured via a solder 18. A head wire 24 is secured to the semiconductor chip 20 via a solder 22; the head wire 24 comprises a end portion or head 26 and a wire end 28 joined to it. A sleeve 32 is disposed in a circumferential groove 30 of the press-fit base 12, producing a void 34 inside the sleeve 32. The void 34 is dimensioned such that the end portion or head 26 and part of the wire end 28 of the head wire 24 are located in it. A lateral edge 36 of the semiconductor chip 20 is provided with a passivation layer 38. The void 34 is filled with an encapsulation 40, for instance from a cast resin. The securing region 14 also has a collar 44, extending axially and radially from a peripheral end portion 42 of the securing region 14. The collar 44 protrudes into the encapsulation 40, resulting in an undercut 46 below the collar 44. The press-fit base may have a knurled face 48 on its outer circumference.

In the rectifier diode 10 shown in FIG. 1, it is essential to the invention, for which details will be discussed hereinafter in the further drawing figures, that the collar 44 meshes with the encapsulation 40; that is, it is enclosed by the encapsulation, so that overall a positive engagement between the head wire 24 and the press-fit base 12 is achieved. As a result of this positive engagement, the semiconductor chip 20 and the solders 18 and 22, in particular, are tension-relieved. At the moment when a phase supply line, of a motor vehicle generator not shown here, is connected to the wire end 28, the vibration of the motor vehicle that necessarily occurs is transmitted via the head wire 24 to the semiconductor chip 20 and the solders 18 and 22. This region is thus exposed to considerable tensile strain, which would cause detachment of the semiconductor chip 20 unless adequate tension relief is created.

Figure 2:
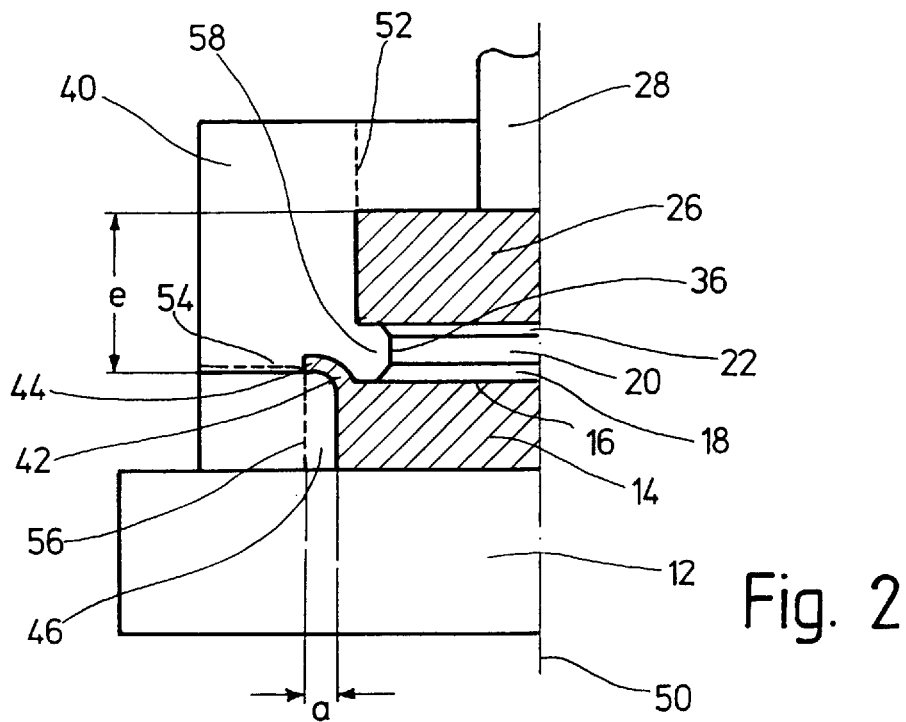
FIG. 2 is a detailed cutaway cross-sectional view of a portion of the rectifier diode shown in FIG. 1.

The layout and mode of operation are shown in further detail in FIG. 2 in an enlarged view of this region. Parts identical to those of FIG. 1 are provided with the same reference numerals and not described again here. The collar 44 extending from the peripheral end portion 42 of the securing region 14 can clearly be seen. The collar 44 is enclosed by the encapsulation 40 and thus anchors the encapsulation 40 is anchored over the head 26 and the securing region 14. The encapsulation 40 is thus formed by a cast resin cylinder, which adapts to the outer contours predetermined by the head or end portion 26 and the securing region 14 and surrounds them with positive engagement. For tension relief along the axis 50, a region of the encapsulation 40 here identified by a length l is decisive. Upon tension relief between the head wire 24 and the press-fit base 12 or securing region 14, the region having the length l is extended by a length l. The tension relief is all the more effective, the smaller l becomes for a given tensile force. In accordance with Hooke's formula $$\Delta e = \frac{\sigma}{E} \cdot l$$

l is proportional to the length l and is inversely proportional to a modulus of elasticity, symbolized by E, of the encapsulation 40. The value a here stands for a predetermined and hence constant tension.

By a suitable choice of the encapsulation 40 and hence of the modulus of elasticity E of the encapsulation 40 and by means of the shortest possible length l, pronounced tension relief can thus be established. By varying the collar 44, influence can be exerted directly upon the length l. Because the collar 44 is lengthened in the axial direction beyond the securing face 16, the length l can be reduced still further.

Details of this will be discussed in conjunction with the later drawing figures. The effective tensile strain between the head wire 24 and the press-fit base 12 must be absorbed by a first cylinder face 52, a second cylinder face 54, and a circular-annular face 56. The load-bearing area of the circular-annular face 56 can highly advantageously be adjusted also by the choice of a step height of the securing region 14 and then the other by a choice of the structure of the collar 44. The area of the cylinder face 54 can also be adjusted by the choice of a spacing a of an outer end or edge 44' of the collar 44 from the peripheral end portion 42 of the securing region 14. The greater the chosen spacing a, the smaller the cylinder face 54 becomes, and thus the larger the region of the encapsulation 40 that forms the undercut 46 becomes.

In a region 58 partially enclosed by the collar 44 of the semiconductor chip 20 and the end portion 26 of the head wire 24, an etching solution can easily be introduced before the encapsulation 40 is provided; with this solution, the edge 36 of the semiconductor chip 20 must be cleaned after the chip has been soldered in place, in order to generate low depletion currents. It is equally easy to provide the passivation layer 38 shown in FIG. 1.

Figures 3, 4, 5:
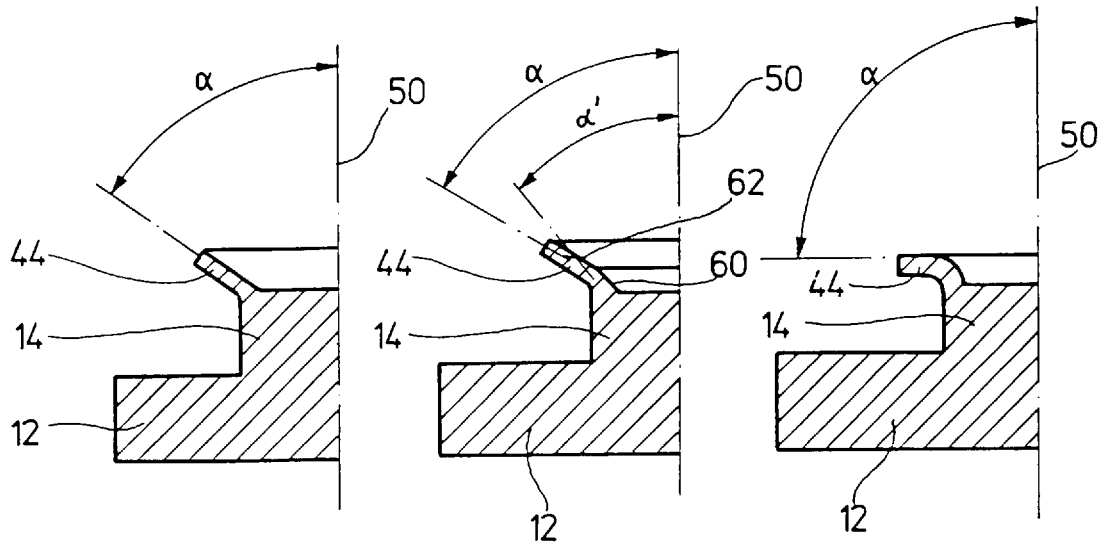
FIG. 3 is a detailed diagrammatic view of ▓- a first embodiment of the invention.
FIG. 4 is a detailed diagrammatic view of ▓- a second embodiment of the invention.
FIG. 5 is a detailed diagrammatic view of ▓- a third embodiment of the invention.

In FIGS. 3–5, various possible embodiments of the collar 44 are shown. Once again, identical elements are identified by the same reference numerals. It is clear from FIG. 3 that the collar 44 is integrally embodied with the securing region 14. Here, the collar 44 is at an angle a from the axis 50. By means of adjusting the angle α selected, both the length l described in conjunction with FIG. 2 and the area of the cylinder face 54 and of the circular-annular face 56 can be adjusted. Accordingly, direct influence on the tension relief is possible by means of a simple choice of an angle α.

In FIG. 4 it becomes clear that the collar 44 may have a first portion 60 and a second portion 62. The angles 60 and 62 are then disposed at different angles α and α', respectively, from the axis 50. By varying different angles α for a collar 44, the tension relief performance of the entire rectifier diode 10 can be adjusted quite easily. In particular, better accessibility of the region 58 described in conjunction with the drawing for the etching solution or the passivation layer is also achieved.

Figure 6:
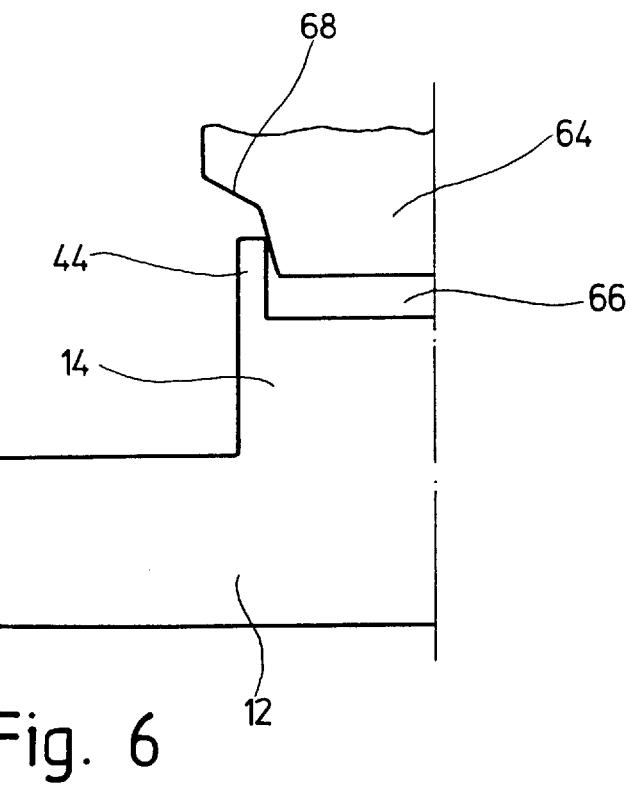
FIG. 6 is a diagrammatic cross-sectional view showing a possible method of producing the collar on the axially extending securing region of the rectifier diode according to the invention.

FIG. 5 shows a collar 44 that is embodied as a bead. As a result of the flanging over of the collar 44 as shown here, which is easy to accomplish, a very large angle α, in this case 90°, is achievable, so that although on the one hand the length l is increased, nevertheless the tension relief can be varied favorably overall by an adjustment of the area of the cylinder face 54 and circular-annular face 56. The making of the collar 44 shown as an example in FIGS. 3–5 is illustrated by FIG. 6. Since as a rule the press-fit base 12 is embodied rotationally symmetrically, the entire press-fit base 12, with its securing region 14 and a circumferential lengthening of the securing region 14 that later yields the collar 44, can be made in a simple way as a turned part. By introducing a forming tool 64 into a void 66 formed by the as-yet unshaped collar 44, the collar 44 can be formed onto the securing region 14 in a desired way. A work face 68 of the forming tool 64 is embodied such that the contours of the collar 44 shown as examples in FIGS. 3–5 are the result. Overall, it is accordingly possible to put the press-fit base 12 into its final form without metal-cutting machining of the already prefabricated turned part.

Figure 7:
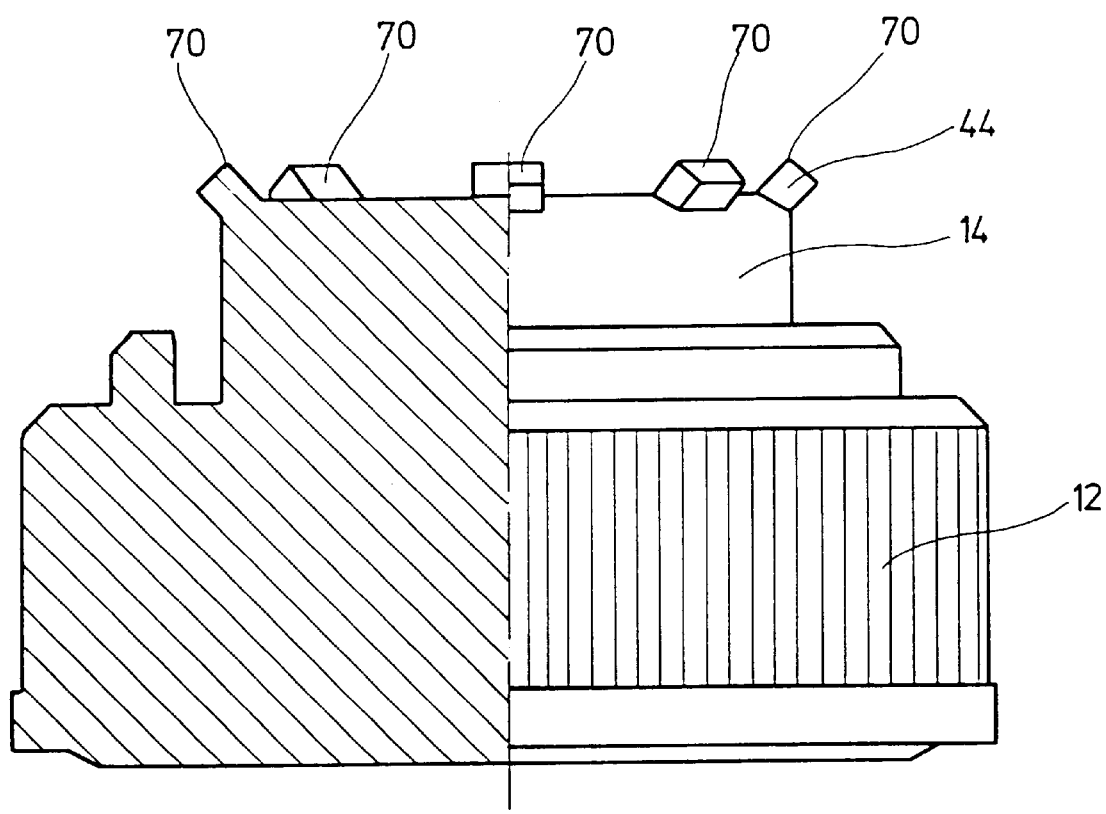
FIG. 7 is a partially cross-sectional, partially side view of an alternative embodiment of the rectifier diode according to the invention.

FIG. 7, in a partially cutaway cross section, shows a further variant embodiment of the press-fit base 12. The collar 44 formed onto the securing region 14 is formed here by individual collar segments 70, which are spaced apart from one another on the peripheral end portion 42 of the securing region 14. The spacing between the individual segments 70 can be freely chosen and can be adjusted in accordance with the desired tension relief. By means of this embodiment, on the one hand the segments 70 here forming the collar 44, as already discussed in conjunction with FIGS. 1–6, have a direct influence on the tension relief of the rectifier diode 10, and on the other hand, because of the interstices between the segments 70, greatly improved introduction of the etching solution or of the passivation layer at the edge 36 of the semiconductor chip 20 is possible. The segments 70 may likewise have the contours shown as examples in FIGS. 3–5.

I claim:

1. A rectifier diode comprising
   - a press-fit base (12) including an axially extending securing region (14) for a semiconductor chip (20);
   - a head wire (24) attached to the semiconductor chip (20);
   - an encapsulation (40) for at least a part of the axially extending securing region (14) and an end portion (26) of said head wire (24) connected to the semiconductor chip (20);
   - a collar (44) extending from a peripheral end portion (42) of the securing region (14), said collar (44) extending axially beyond a securing face (16) on the securing region (14) for the semiconductor chip and inclined to an axis (50) of the securing region (14);
   - wherein the securing face (16) is closer to said head wire (24) than is an outer edge region (12') of the press-fit base (12), said collar (44) is in one-piece with the securing region (14), said collar (44) includes a first portion (60) and a second portion (62), said first portion (60) extends from the peripheral end portion (42) of the securing region (14) and is inclined to said axis (50) at a first positive angle ($\alpha'$) and said second portion (62) of said collar extends from said first portion of said collar and is inclined at a second positive angle ($\alpha$) such that said second positive angle ($\alpha$) is greater than said first positive angle ($\alpha'$).

2. The rectifier diode as defined in claim 1, wherein the first portion (60) and the second portion (62) merge smoothly and continuously with each other.

3. The rectifier diode as defined in claim 1, wherein the first portion (60) and the second portion (62) merge in an angular manner with respect to each other.

4. The rectifier diode as defined in claim 1, wherein said encapsulation (40) surrounds and laterally encloses said axially-extending securing region (14) as well as said end portion (26) of said head wire (24) and extends below said securing face (16) of said securing region (14) in an axial direction so that an undercut region (46) axially below said collar (44) is filled with said encapsulation (40) to anchor the encapsulation and an outer peripheral edge (44') of said collar (44) has a predetermined spacing (a) from the securing region (14) selected to provide a predetermined tension relief between the head wire (24) and the securing region (14).

5. The rectifier diode as defined in claim 4, wherein said predetermined spacing (a) is determined according to a length of said collar (44).

6. The rectifier diode as defined in claim 4, wherein said predetermined spacing (a) is determined according to a length of said second portion (62) of said collar (44).

7. The rectifier diode as defined in claim 4, wherein said predetermined spacing (a) is determined according to at least one of said first angle and said second angle of said portions of said collar (44).

8. The rectifier diode as defined in claim 4, wherein said encapsulation comprises a cast resin material.

9. The rectifier diode as defined in claim 4, wherein a portion of said encapsulation extending between an end of said end portion (26) and said collar (44) has a predetermined length (l) determined according to said predetermined tension relief.

10. The rectifier diode as defined in claim 9, wherein said predetermined length (l) of said portion of said encapsulation is determined according to said first angle and said second angle.

11. The rectifier diode as defined in claim 9, wherein said predetermined length (l) of said portion of said encapsulation is determined according to a length of said collar (44).

12. The rectifier diode as defined in claim 1, wherein said collar (44) consists of a plurality of individual segments (70) spaced apart from each other circumferentially around said axially extending securing region (14).

* * * * *